US009331658B2

(12) United States Patent
Taniguchi

(10) Patent No.: US 9,331,658 B2
(45) Date of Patent: May 3, 2016

(54) FILTER CIRCUIT

(71) Applicant: Murata Manufacturing Co., Ltd., Nagaokakyo-shi, Kyoto-fu (JP)

(72) Inventor: Tetsuo Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 228 days.

(21) Appl. No.: 14/053,715

(22) Filed: Oct. 15, 2013

(65) Prior Publication Data
US 2014/0203890 A1 Jul. 24, 2014

(30) Foreign Application Priority Data
Jan. 18, 2013 (JP) .................. 2013-007217

(51) Int. Cl.
*H03H 7/01* (2006.01)
*H03H 7/00* (2006.01)
*H03H 7/46* (2006.01)

(52) U.S. Cl.
CPC ............... *H03H 7/00* (2013.01); *H03H 7/1791* (2013.01); *H03H 7/463* (2013.01); *H03H 7/0115* (2013.01); *H03H 7/1758* (2013.01); *H03H 7/1775* (2013.01)

(58) Field of Classification Search
None
See application file for complete search history.

(56) References Cited

U.S. PATENT DOCUMENTS

| | | | | |
|---|---|---|---|---|
| 5,054,114 A | * | 10/1991 | Erickson | ............ 455/78 |
| 5,473,293 A | * | 12/1995 | Chigodo | ........... H01P 1/15 333/104 |
| 5,594,394 A | * | 1/1997 | Sasaki et al. | ............. 333/103 |
| 5,625,894 A | * | 4/1997 | Jou | ............. 455/78 |
| 6,011,959 A | * | 1/2000 | Reeser et al. | ........... 455/76 |
| 6,731,184 B1 | * | 5/2004 | Muto | ......... H04B 1/48 333/103 |
| 6,927,648 B2 | * | 8/2005 | Furuya | ........ H03H 7/0115 333/132 |
| 7,023,296 B2 | * | 4/2006 | Uriu | ........... H01P 1/15 333/101 |
| 7,057,472 B2 | * | 6/2006 | Fukamachi | ...... H03H 7/0115 333/101 |
| 7,356,349 B2 | * | 4/2008 | Furutani | ........ H04B 1/005 455/552.1 |
| 7,561,005 B2 | * | 7/2009 | Harada | ........ H03H 7/463 333/133 |

(Continued)

FOREIGN PATENT DOCUMENTS

EP 1 184 979 A2 3/2002
EP 1 223 634 A2 7/2002

(Continued)

OTHER PUBLICATIONS

Official Communication issued in corresponding Japanese Patent Application No. 2013-007217, mailed on Dec. 9, 2014.

(Continued)

*Primary Examiner* — Tuan T Lam
(74) *Attorney, Agent, or Firm* — Keating & Bennett, LLP

(57) ABSTRACT

A filter circuit includes an antenna-side circuit, a transmission-side circuit, a reception-side circuit, and an external connection capacitor. The antenna-side circuit is connected to an antenna-side terminal. The transmission-side circuit is connected to a transmission-side terminal and the antenna-side circuit. The reception-side circuit is connected to a reception-side terminal, the antenna-side circuit, and ground. The external connection capacitor is connected between an external control terminal and a connection point between the antenna-side circuit and the reception-side circuit. The antenna-side circuit and the transmission-side circuit constitute a low pass filter. The antenna-side circuit and the reception-side circuit constitute a band pass filter. The reception-side circuit includes an LC parallel resonant circuit.

16 Claims, 12 Drawing Sheets

(56) References Cited

U.S. PATENT DOCUMENTS

| | | | |
|---|---|---|---|
| 7,904,394 B2* | 3/2011 | Marks et al. | 705/404 |
| 7,965,989 B2 | 6/2011 | Iwata | |
| 8,179,206 B2* | 5/2012 | Nakagawa et al. | 333/103 |
| 2004/0032706 A1 | 2/2004 | Kemmochi et al. | |
| 2004/0246074 A1* | 12/2004 | Humphrey | H03J 5/244 333/174 |
| 2006/0194550 A1* | 8/2006 | Block et al. | 455/78 |
| 2006/0211382 A1* | 9/2006 | Kemmochi | H04B 1/005 455/78 |
| 2007/0270105 A1* | 11/2007 | Uejima | H04B 1/0057 455/78 |
| 2007/0296525 A1* | 12/2007 | Kokubo | H03H 7/0115 333/175 |
| 2009/0079516 A1* | 3/2009 | Miyata | H01F 17/0013 333/175 |
| 2010/0026419 A1* | 2/2010 | Hara | H03H 9/0028 333/175 |
| 2011/0140806 A1 | 6/2011 | Taniguchi | |

FOREIGN PATENT DOCUMENTS

| | | |
|---|---|---|
| EP | 2 144 377 A1 | 1/2010 |
| JP | 11-251957 A | 9/1999 |
| JP | 2003-133989 A | 5/2003 |
| JP | 2011-124880 A | 6/2011 |
| WO | 02/37709 A1 | 5/2002 |

OTHER PUBLICATIONS

Official Communication issued in corresponding European Patent Application No. 13195091.7, mailed on Feb. 12, 2014.

Official Communication issued in corresponding European Patent Application No. 13195091.7, mailed on Apr. 28, 2014.

* cited by examiner

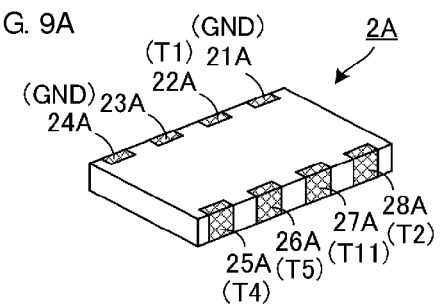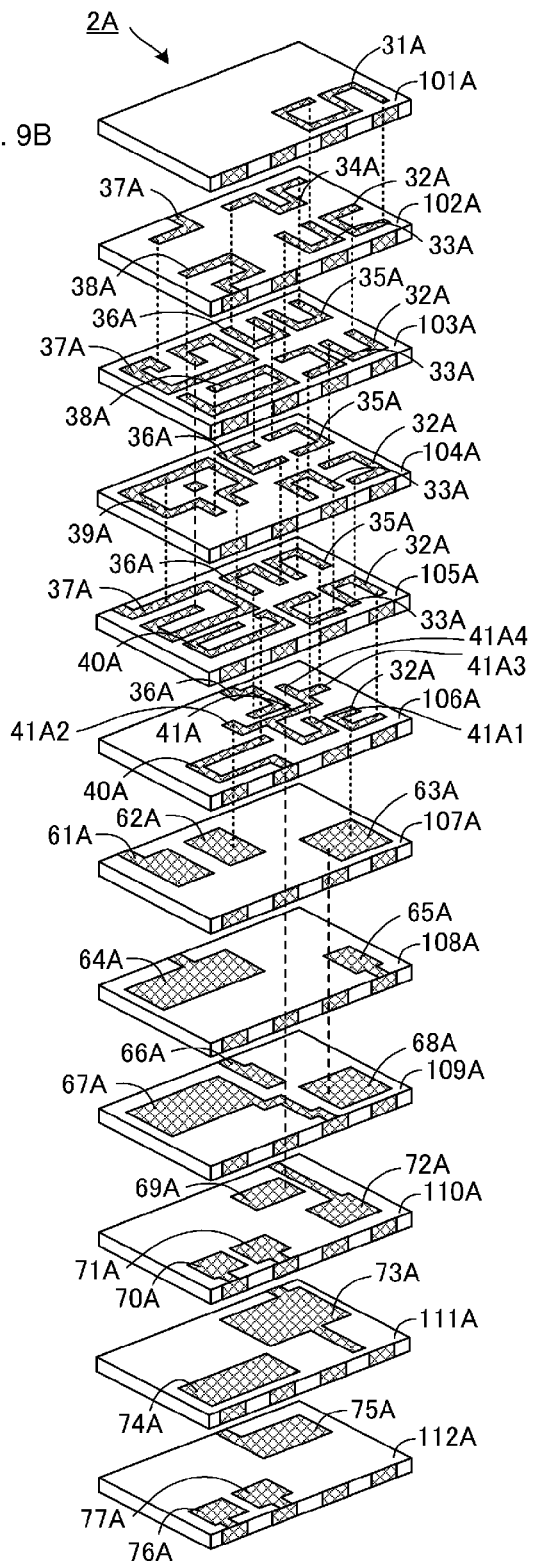

FILTER CIRCUIT

BACKGROUND OF THE INVENTION

1. Field of the Invention

The present invention relates to a filter circuit including an external control terminal.

2. Description of the Related Art

A filter circuit including an external control terminal is mounted, for example, between an antenna and an IC for transmission and reception. In such a filter circuit, a signal path for transmission and reception is switched by the external control terminal. As an existing filter circuit, for example, there is a filter circuit shown in FIG. 12.

FIG. 12 is a circuit diagram showing an existing filter circuit 1P (see CC1120, p23, [online], Texas instruments, [searched on Sep. 18, 2012], the Internet <URL: http://www.ti.com/lit/ds/symlink/cc1120.pdf>). The filter circuit 1P includes an antenna-side circuit 11P, a transmission-side circuit 12P, and a reception-side circuit 13P.

The antenna-side circuit 11P is connected to an antenna-side terminal T1. The transmission-side circuit 12P is connected to a transmission-side terminal T2 and the antenna-side circuit 11P. The reception-side circuit 13P is connected to reception-side balanced terminals T4 and T5 and the antenna-side circuit 11P. A connection point 16 between the antenna-side circuit 11P and the reception-side circuit 13P is connected to an external control terminal T11.

The antenna-side terminal T1 is connected to an antenna AT. The transmission-side terminal T2 is connected to an external circuit TX. The reception-side balanced terminals T4 and T5 are connected to an external circuit RX. The external control terminal T11 is connected to an external circuit CTL.

The antenna-side circuit 11P includes a low pass filter. The transmission-side circuit 12P includes an LC parallel resonant circuit. The reception-side circuit 13P includes a balanced-to-unbalanced conversion circuit. It should be noted that a frequency band used for transmission and a frequency band used for reception overlap each other.

At the time of transmission, the impedance of the external circuit CTL is set to be sufficiently low. Thus, the external control terminal T11 is grounded, and the potential of the connection point 16 becomes a ground potential. As a result, the reception-side circuit 13P and the external circuit RX do not influence the characteristics of the filter circuit 1P. Thus, a transmission signal inputted to the transmission-side terminal T2 passes through a transmission filter circuit composed of the antenna-side circuit 11P and the transmission-side circuit 12P, and is outputted from the antenna-side terminal T1 to the antenna AT.

At the time of reception, the impedances of the external circuit CTL and the external circuit TX are set to be sufficiently high. Thus, the filter circuit 1P becomes equivalent to a reception filter circuit composed of the antenna-side circuit 11P and the reception-side circuit 13P. Thus, a reception signal inputted to the antenna-side terminal T1 passes through the low pass filter of the antenna-side circuit 11P, is converted to a balanced signal by the balanced-to-unbalanced conversion circuit, and is outputted from the reception-side balanced terminals T4 and T5.

In other words, it is possible to switch between transmission and reception by controlling the impedance characteristics of the external circuit CTL. The filter circuit 1P becomes equivalent to a transmission filter circuit at the time of transmission, and becomes equivalent to a reception filter circuit at the time of reception.

The external circuit CTL shown in FIG. 12 is, for example, an IC (Integrated Circuit). In general, the circuit elements constituting the filter circuit 1P and this IC are mounted on different motherboards. Thus, a line connecting the external control terminal T11 to the IC is long to some extent and thus has a parasitic inductance. As a result, there is a concern that the external control terminal T11 is not fully grounded.

In this case, the connection point 16 is short-circuited to the external control terminal T11, and thus the transmission filter circuit composed of the antenna-side circuit 11P and the transmission-side circuit 12P is influenced by the parasitic inductance of the line. The parasitic inductance of the line is changed in response to the line length, and thus the characteristics of the transmission filter circuit are influenced by the line length of the line and become unstable.

SUMMARY OF THE INVENTION

Accordingly, preferred embodiments of the present invention provide a filter circuit which has stable characteristics independent of a mounting form of a filter circuit and in which switching between transmission and reception is performed by an external control terminal.

According to a preferred embodiment of the present invention, a filter circuit includes first, second and third circuits and an external connection capacitor. The first circuit is connected to a first terminal. The second circuit is connected to a second terminal and the first circuit. The external connection capacitor is connected between an external control terminal and a connection point between the first and third circuits. The first and third circuits constitute a first filter circuit. The first and third circuits constitute a second filter circuit. The third circuit includes an LC parallel resonant circuit. A first end of the LC parallel resonant circuit is connected to the connection point. A second end of the LC parallel resonant circuit is connected to ground.

With this configuration, the impedance between ground and the connection point between the first and third circuits is changed by changing the impedance of the circuit connected to the external control terminal. Thus, it is possible to switch a signal path within the filter circuit according to a preferred embodiment of the present invention, and the filter circuit according to a preferred embodiment of the present invention is able to support transmission and reception. In other words, it is possible to realize a filter circuit in which switching between transmission and reception is performed by changing the impedance of the circuit connected to the external control terminal.

In addition, when the external control terminal is connected to ground via a line, a circuit between ground and the connection point between the first and third circuits is an LC circuit including the external connection capacitor, a parasitic inductor of the line, and the third circuit.

In this case, the parasitic inductor is connected in parallel to the inductor constituting the third circuit. In addition, in general, the value of the parasitic inductor is sufficiently low. Thus, the parasitic inductor almost does not influence the impedance of the LC circuit in a used frequency band. As a result, the filter circuit exhibits stable characteristics independent of a mounting form such as the line length of the line connected to the external control terminal.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9A is an external perspective view of a laminate.

FIG. 9B is an exploded perspective view of the laminate.

DETAILED DESCRIPTION OF THE PREFERRED EMBODIMENTS

First Preferred Embodiment

Figure 1:
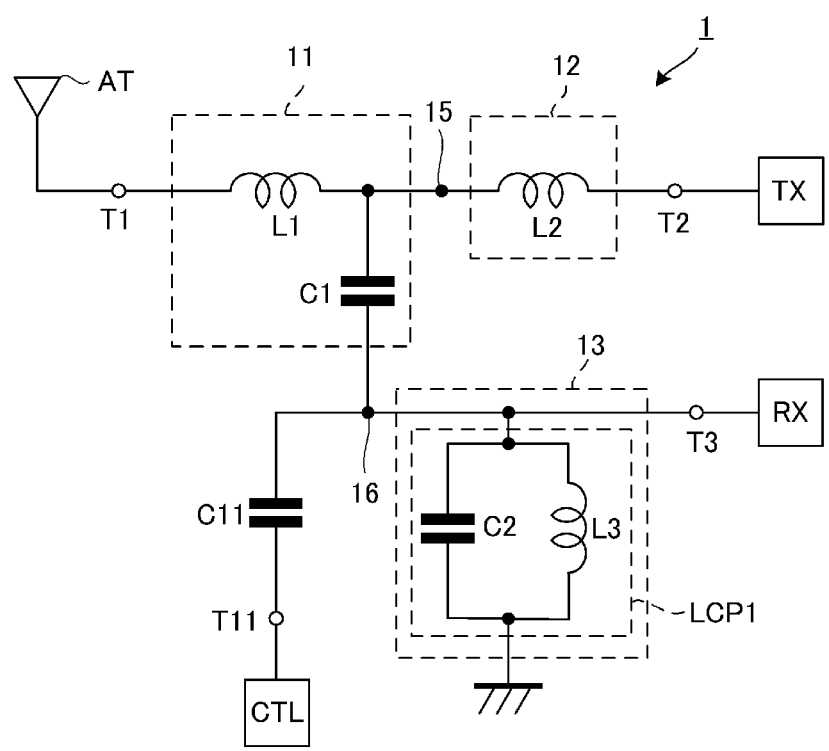
FIG. 1 is a circuit diagram showing a filter circuit according to a first preferred embodiment of the present invention.

A filter circuit 1 according to a first preferred embodiment of the present invention will be described. FIG. 1 is a circuit diagram showing the filter circuit 1. The filter circuit 1 includes an antenna-side circuit 11, a transmission-side circuit 12, a reception-side circuit 13, and an external connection capacitor C11. The antenna-side circuit 11 corresponds to a first circuit. The transmission-side circuit 12 corresponds to a second circuit. The reception-side circuit 13 corresponds to a third circuit.

The antenna-side circuit 11 is connected to an antenna-side terminal T1. The transmission-side circuit 12 is connected to a transmission-side terminal T2 and the antenna-side circuit 11. The reception-side circuit 13 is connected to a reception-side terminal T3, the antenna-side circuit 11, and ground. The antenna-side terminal T1 corresponds to a first terminal. The transmission-side terminal T2 corresponds to a second terminal. The reception-side terminal T3 corresponds to a third terminal.

A first end of the external connection capacitor C11 is connected to a connection point 16 between the antenna-side circuit 11 and the reception-side circuit 13. A second end of the external connection capacitor C11 is connected to an external control terminal T11. The antenna-side terminal T1 is connected to an antenna AT, the transmission-side terminal T2 is connected to an external circuit TX, the reception-side terminal T3 is connected to an external circuit RX, and the external control terminal T11 is connected to an external circuit CTL.

The antenna-side circuit 11 includes an inductor L1 and a capacitor C1. A first end of the inductor L1 is connected to the antenna-side terminal T1, and a second end of the inductor L1 is connected to a connection point 15 between the antenna-side circuit 11 and the transmission-side circuit 12 and is connected to a first end of the capacitor C1. A second end of the capacitor C1 is connected to the connection point 16.

The transmission-side circuit 12 includes an inductor L2. The inductor L2 is connected between the connection point 15 and the transmission-side terminal T2.

The reception-side circuit 13 includes an LC parallel resonant circuit LCP1 including an inductor L3 and a capacitor C2. A first end of the LC parallel resonant circuit LCP1 is connected to the connection point 16 and the reception-side terminal T3. A second end of the LC parallel resonant circuit LCP1 is connected to ground.

Figure 2:
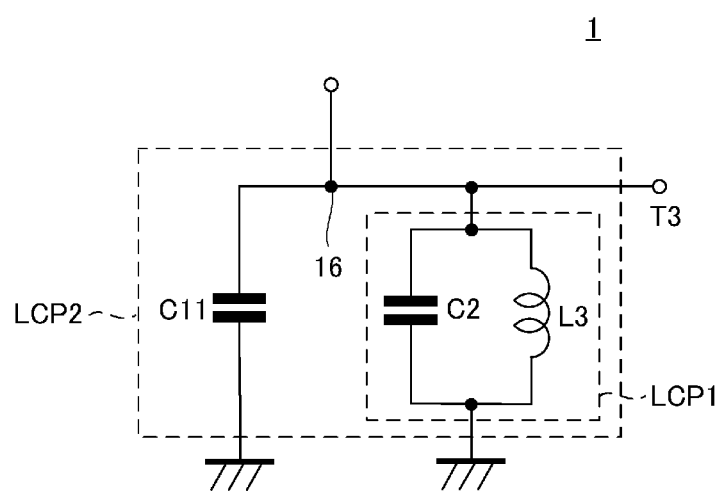
FIG. 2 is a circuit diagram showing a portion of the filter circuit when an external control terminal is grounded.

First, at the time of transmission, the impedance of the external circuit CTL is set to be sufficiently low. Thus, the external control terminal T11 is grounded. In this case, the external connection capacitor C11, the capacitor C2, and the inductor L3 constitute an LC parallel resonant circuit LCP2 as shown in FIG. 2. FIG. 2 is a circuit diagram showing a portion of the filter circuit 1 when the external control terminal T11 is grounded. The resonant frequency of the LC parallel resonant circuit LCP2 is lower than the resonant frequency of the LC parallel resonant circuit LCP1 due to the capacitance of the external connection capacitor C11.

In the first preferred embodiment, a frequency band used for transmission and a frequency band used for reception overlap each other. In addition, the resonant frequency of the LC parallel resonant circuit LCP1 is located within the frequency band for transmission.

Thus, the resonant frequency of the LC parallel resonant circuit LCP2 is out of the frequency band for transmission. In addition, in a pass band at the time of transmission, the impedance between the connection point 16 and ground is decreased. As a result, in the pass band at the time of transmission, the external circuit RX almost does not influence transmission signals.

Figure 3A:
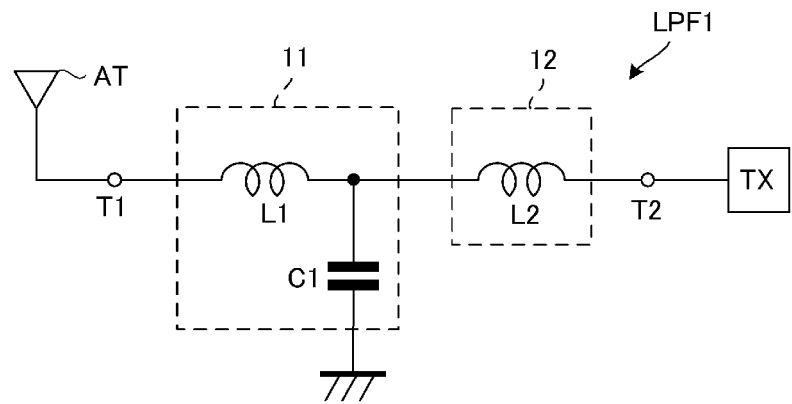
FIG. 3A is an equivalent circuit diagram of the filter circuit at the time of transmission.

Therefore, at the time of transmission, the filter circuit 1 becomes substantially equivalent to a low pass filter LPF1 shown in FIG. 3A. FIG. 3A is an equivalent circuit diagram of the filter circuit 1 at the time of transmission. The low pass filter LPF1 includes the antenna-side circuit 11 and the transmission-side circuit 12. The capacitor C1 of the antenna-side circuit is connected to ground. The low pass filter LPF1 corresponds to a first filter circuit. It should be noted that when approximated more accurately, the ground capacitance of the low pass filter LPF1 becomes the sum of the capacitances of the capacitors C1 and C2 and the external connection capacitor C11.

A transmission signal inputted to the transmission-side terminal T2 passes through the low pass filter LPF1 and is outputted from the antenna-side terminal T1. When the transmission signal passes through the low pass filter LPF1, the low pass filter LPF1 removes a harmonic component of the transmission signal.

At the time of reception, the impedances of the external circuit CTL and the external circuit TX are set to be sufficiently high. In this case, the transmission-side circuit 12 and the external connection capacitor C11 do not influence reception signals.

Figure 3B:
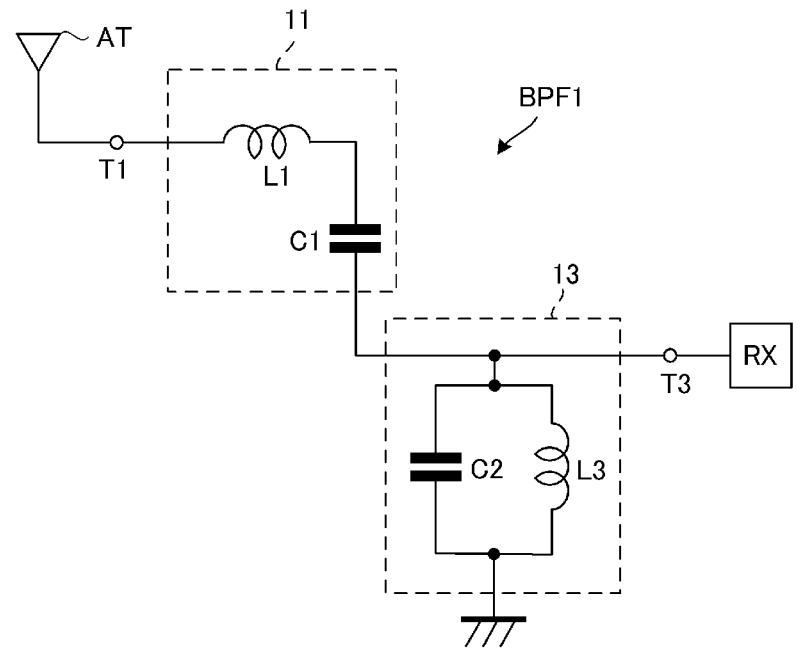
FIG. 3B is an equivalent circuit diagram of the filter circuit at the time of reception.

Therefore, at the time of reception, the filter circuit 1 becomes substantially equivalent to a band pass filter BPF1 shown in FIG. 3B. FIG. 3B is an equivalent circuit diagram of the filter circuit 1 at the time of reception. The band pass filter BPF1 includes the antenna-side circuit 11 and the reception-side circuit 13. The band pass filter BPF1 corresponds to a second filter circuit.

When the frequency of a reception signal inputted to the antenna-side terminal T1 is located within the pass band of the band pass filter BPF1, the reception signal passes through the band pass filter BPF1 and is outputted from the reception-side terminal T3.

According to the first preferred embodiment, as described above, it is possible to switch between transmission and reception by controlling the impedance characteristics of the external circuit CTL. In other words, when the external control terminal T11 is grounded, it is possible to use the filter circuit 1 as the low pass filter LPF1 including the antenna-side terminal T1 and the transmission-side terminal T2. When the impedances of the external circuit CTL and the external circuit TX are set to be sufficiently high, it is possible to use the filter circuit 1 as the band pass filter BPF1 including the antenna-side terminal T1 and the reception-side terminal T3.

In addition, as described above, a line connecting the external control terminal T11 to the external circuit CTL includes a parasitic inductor. Thus, in grounding the external control terminal T11 by controlling the external circuit CTL, the external control terminal T11 is connected to ground via the parasitic inductor.

Figure 4:
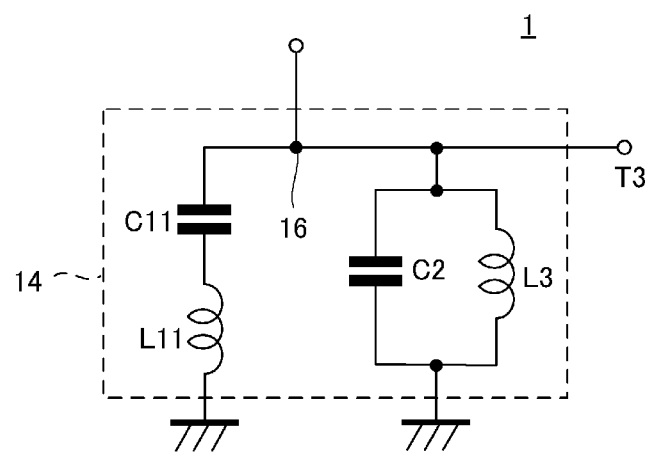
FIG. 4 is a circuit diagram of a portion of the filter circuit when the external control terminal is connected to ground via a line.

FIG. 4 is a circuit diagram showing a portion of the filter circuit 1 when the external control terminal T11 is connected to ground via the line. A parasitic inductor L11 is connected between the external control terminal T11 and ground. An LC circuit 14 includes the inductor L3, the parasitic inductor L11, the capacitor C2, and the external connection capacitor C11.

The value of the parasitic inductor L11 is very low as compared to the element values of the other circuit elements. In addition, only when the parasitic inductor L11 mainly contributes to resonance of the LC circuit 14, the parasitic inductor L11 influences the impedance between the connection point 16 and ground. Furthermore, there is the possibility that the parasitic inductor L11 influences the characteristics of the filter circuit 1 that serves as the low pass filter LPF1.

When the parasitic inductor L11 and the external connection capacitor C11 mainly contribute and the LC circuit 14 resonates, the magnitude of the impedance between the connection point 16 and ground becomes nearly 0. Thus, at this resonant frequency, the parasitic inductor L11 almost does not influence the characteristics of the low pass filter LPF1.

In addition, when the parasitic inductor L11 and the capacitor C2 mainly contribute and the LC circuit 14 resonates, the magnitude of the impedance between the connection point 16 and ground becomes a maximum value. However, the size of the parasitic inductor L11 is very small, and thus the resonant frequency at that time becomes sufficiently high as compared to a frequency band in which a harmonic occurs. Thus, as long as the low pass filter LPF1 is used in a predetermined frequency band, the parasitic inductor L11 almost does not influence the characteristics of the low pass filter LPF1.

Therefore, the parasitic inductor L11 almost does not influence the characteristics of the filter circuit 1. In other words, the filter circuit 1 exhibits stable characteristics independent of a mounting form such as the line length of the line.

Figure 5A:
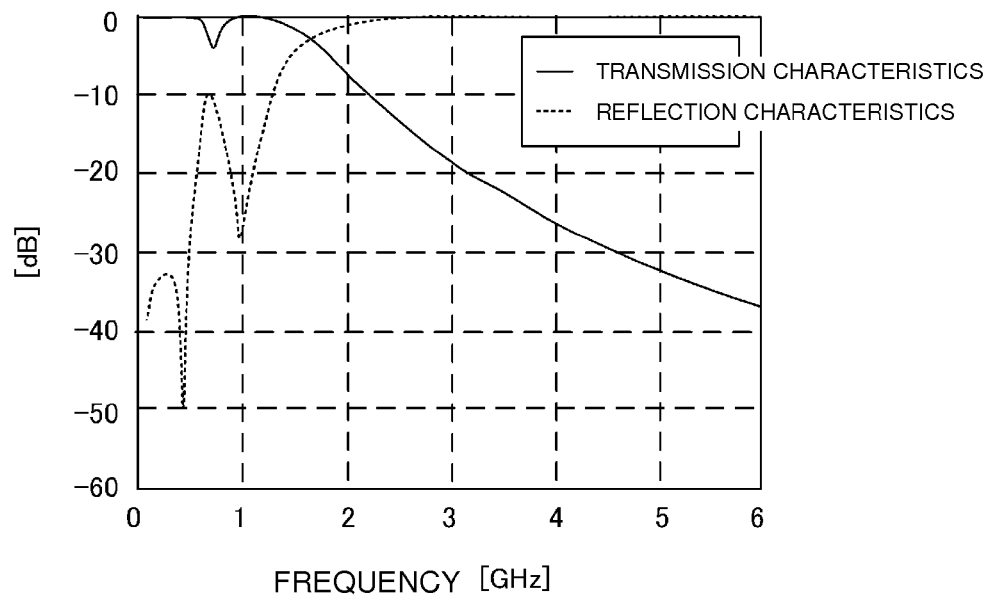
FIG. 5A is a diagram showing characteristics of the filter circuit when the external control terminal is grounded.

FIG. 5A is a diagram showing characteristics of the filter circuit 1 when the external control terminal T11 is grounded. In FIG. 5A, a solid line indicates transmission characteristics between the antenna-side terminal T1 and the transmission-side terminal T2, and a broken line indicates reflection characteristics at the antenna-side terminal T1. It should be noted that FIG. 5A is a result of calculation by simulation.

When the frequency of a signal is lower than about 1 GHz, the insertion loss is nearly 0 dB. As the frequency of the signal is increased to be higher than about 1 GHz, the insertion loss is increased. On the other hand, when the frequency of the signal is higher than about 2 GHz, the return loss is nearly 0 dB. As the frequency of the signal is decreased to be lower than about 2 GHz, the return loss is decreased. In other words, the filter circuit 1 serves as a low pass filter whose pass band is a frequency band around 1 GHz and a frequency band lower than around 1 GHz.

Figure 5B:
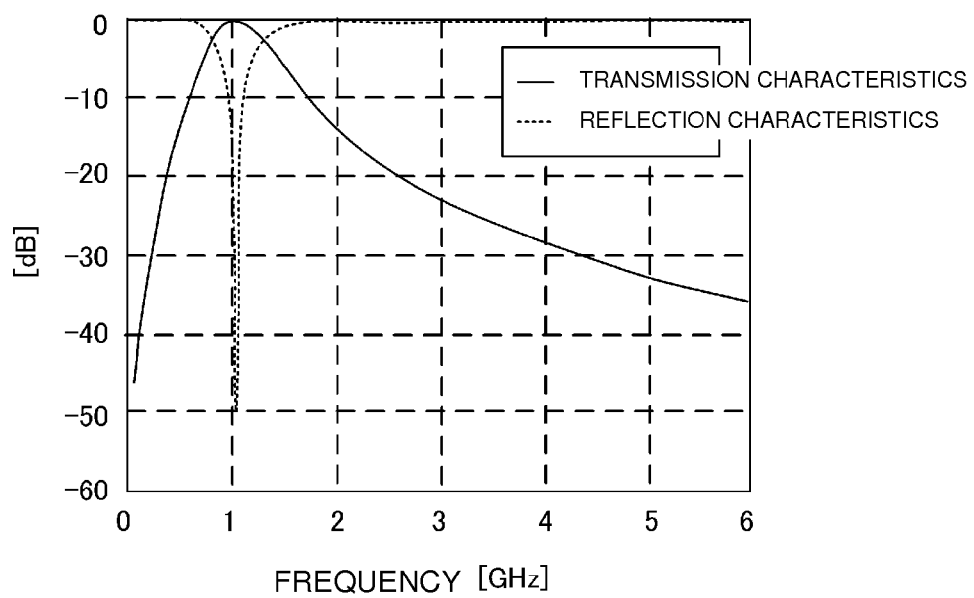
FIG. 5B is a diagram showing characteristics of the filter circuit when the impedances of external circuits are set to be sufficiently high.

FIG. 5B is a diagram showing characteristics of the filter circuit 1 when the impedances of the external circuit CTL and the external circuit TX are set to be sufficiently high. In FIG. 5B, a solid line indicates transmission characteristics between the antenna-side terminal T1 and the reception-side terminal T3, and a broken line indicates reflection characteristics at the antenna-side terminal T1. It should be noted that FIG. 5B is a result of calculation obtained by simulation.

When the frequency of a signal is around 1 GHz, the insertion loss becomes nearly 0 dB. As the frequency of the signal deviates from around 1 GHz, the insertion loss is increased. On the other hand, when the frequency of the signal is around 1 GHz, the return loss is decreased. When the frequency of the signal is not around 1 GHz, the return loss is nearly 0 dB. In other words, the filter circuit 1 serves as a band pass filter having a pass band around 1 GHz.

Figure 6A:
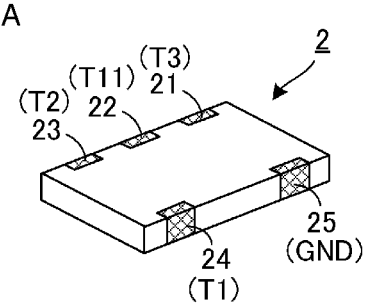
FIG. 6A is an external perspective view of a laminate.
Figure 6B:
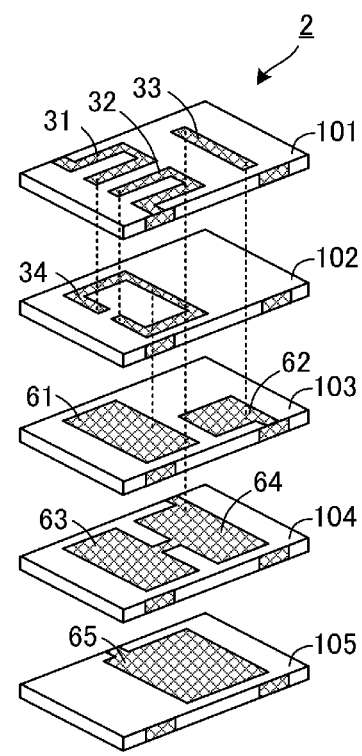
FIG. 6B is an exploded perspective view of the laminate.

FIG. 6A is an external perspective view of the filter circuit 1. FIG. 6B is an exploded perspective view of the filter circuit 1.

The filter circuit 1 preferably includes a laminate 2 having a rectangular or substantially rectangular parallelepiped shape, and the laminate 2 includes outer electrodes 21 to 25 on its surface. The outer electrodes 21, 22, and 23 are spaced apart from each other at a predetermined interval and located on a first side surface of the laminate 2. The outer electrode 22 is located between the outer electrodes 21 and 23. The outer electrode 24 is opposed to the outer electrode 23, the outer electrode 25 is opposed to the outer electrode 21, and the outer electrodes 24 and 25 are located on a second side surface of the laminate 2 (a surface opposite to the first side surface). The outer electrodes 21 to 25 are arranged so as to extend on a top surface and a bottom surface of the laminate 2.

The laminate 2 includes dielectric layers 101 to 105 and electrode layers located on the respective dielectric layers. The dielectric layers 101 to 105 are laminated in the order of their numerals. Hereafter, a rectangular or substantially rectangular electrode layer is referred to as a flat plate electrode, and a substantially linear electrode layer is referred to as a linear electrode.

Linear electrodes 31, 32, and 33 are located on the dielectric layer 101. A first end of the linear electrode 31 is connected to the outer electrode 23. A first end of the linear electrode 32 is connected to the outer electrode 24. The linear electrodes 31 and 32 are preferably arranged in a loop shape or a substantially loop shape.

A linear electrode 34 is located on the dielectric layer 102. A first end of the linear electrode 34 is connected to a second end of the linear electrode 31 through a via electrode. A second end of the linear electrode 34 is connected to a second end of the linear electrode 32 through a via electrode. The linear electrode is preferably arranged in a loop shape or a substantially loop shape.

Flat plate electrodes 61 and 62 are located on the dielectric layer 103. The flat plate electrode 61 is connected to the center of the linear electrode 34 through a via electrode. The flat plate electrode 62 is connected to the outer electrode 25 and is connected to a first end of the linear electrode 33 through a via electrode.

Flat plate electrodes 63 and 64 are located on the dielectric layer 104. The flat plate electrode 63 is connected to the flat plate electrode 64 via a linear electrode. The flat plate electrodes 61 and 63 are opposed to each other with the dielectric layer 103 interposed therebetween. The flat plate electrode 64 is connected to the outer electrode 21 and is connected to a second end of the linear electrode 33 through a via electrode. The flat plate electrodes 62 and 64 are opposed to each other with the dielectric layer 103 interposed therebetween.

A flat plate electrode 65 is located on the dielectric layer 105. The flat plate electrodes 64 and 65 are opposed to each other with the dielectric layer 104 interposed therebetween.

Next, correspondence between the circuit in FIG. 1 and the configuration in FIGS. 6A and 6B will be described.

The antenna-side terminal T1 corresponds to the outer electrode 24, the transmission-side terminal T2 corresponds to the outer electrode 23, the reception-side terminal T3 corresponds to the outer electrode 21, and the external control terminal T11 corresponds to the outer electrode 22. The outer electrode 25 is connected to ground.

The inductor L1 includes the linear electrode 32, a portion from the second end to the center of the linear electrode 34, and the via electrode connecting them. The inductor L2 includes the linear electrode 31, a portion from the first end to the center of the linear electrode 34, and the via electrode connecting them. The inductor L3 includes the linear electrode 33 and the via electrodes connected to both ends of the linear electrode 33.

The capacitor C1 includes the flat plate electrodes 61 and 63 and the dielectric layer 103. The capacitor C2 includes the flat plate electrodes 62 and 64 and the dielectric layer 103. The external connection capacitor C11 includes the flat plate electrodes 63, 64, and 65 and the dielectric layer 104.

According to the first preferred embodiment, when the external control terminal T11 is grounded, the filter circuit 1 becomes equivalent to a T-type low pass filter LPF1. The ground capacitance of the low pass filter LPF1 is the sum of the capacitances of the capacitors C1 and C2 and the external connection capacitor C11. Thus, it is possible to distribute the capacitance of the low pass filter to each capacitor, and hence it is possible to decrease the capacitance of each capacitor. Therefore, it is possible to decrease the surface area of each flat plate electrode constituting each capacitor. Accordingly, when each capacitor is disposed on each layer, it is possible to reduce the size of the laminate 2 in which the filter circuit 1 is provided.

The external connection capacitor C11 is connected directly to the external circuit CTL. Thus, the characteristics of the external connection capacitor C11 are influenced by change in the impedance of the external circuit CTL.

The flat plate electrodes 63, 64, and 65 constituting the external connection capacitor C11 are located on the dielectric layers 104 and 105, not on the dielectric layers 101 to 103 on which the other flat plate electrodes are located. In other words, the flat plate electrodes 63, 64, and 65 are disposed so as to be independent from the other flat plate electrodes.

Thus, it is possible to prevent changes in the characteristics of the external connection capacitor C11 from influencing the characteristics of the other circuit elements. As a result, it is possible to stabilize the characteristics of the filter circuit 1.

In addition, the surface area of a portion where the flat plate electrodes 63 and 64 and the flat plate electrode 65 overlap each other when being seen from a direction perpendicular to the lamination direction is larger than the surface area of a portion where the other opposed flat plate electrodes overlap each other. Thus, the capacitance of the external connection capacitor C11 is greater than the capacitances of the other capacitors. Thus, the resonant frequency of the LC parallel resonant circuit LCP2 is greatly different from the resonant frequency of the LC parallel resonant circuit LCP1.

Meanwhile, as described above, each of the frequency bands used for transmission and reception is around 1 GHz. In addition, the resonant frequency of the LC parallel resonant circuit LCP1 is located within the frequency band for reception.

Thus, it is possible to sufficiently reduce the influence of the LC parallel resonant circuit LCP2 on the transmission characteristics of a transmission signal when the external control terminal T11 is grounded. Accordingly, it is possible to assuredly switch between transmission and reception.

Second Preferred Embodiment

Figure 7:
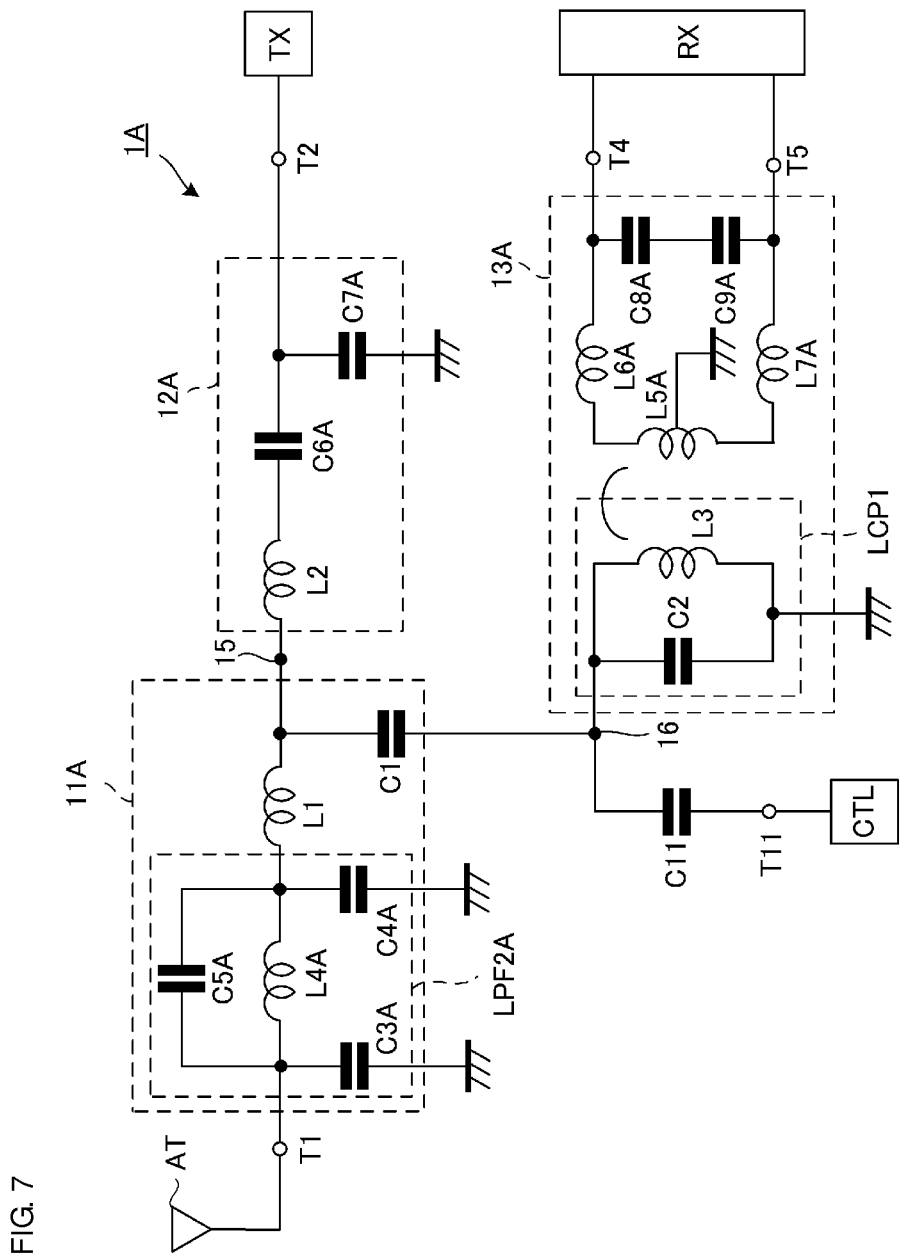
FIG. 7 is a circuit diagram showing a filter circuit according to a second preferred embodiment of the present invention.

A filter circuit 1A according to a second preferred embodiment of the present invention will be described. FIG. 7 is a circuit diagram showing the filter circuit 1A. The filter circuit 1A includes an antenna-side circuit 11A, a transmission-side circuit 12A, a reception-side circuit 13A, and an external connection capacitor C11.

The antenna-side circuit 11A is connected to an antenna-side terminal T1. The transmission-side circuit 12A is connected to a transmission-side terminal T2 and the antenna-side circuit 11A. The reception-side circuit 13A is connected to reception-side balanced terminals T4 and T5, the antenna-side circuit 11A, and ground. The reception-side balanced terminals T4 and T5 correspond to third and fourth terminals.

A first end of the external connection capacitor C11 is connected to a connection point 16 between the antenna-side circuit 11A and the reception-side circuit 13A. A second end of the external connection capacitor C11 is connected to an external control terminal T11.

The antenna-side terminal T1 is connected to an antenna AT, the transmission-side terminal T2 is connected to an external circuit TX, the reception-side balanced terminals T4 and T5 are connected to an external circuit RX, and the external control terminal T11 is connected to an external circuit CTL.

The antenna-side circuit 11A includes an inductor L4A and capacitors C3A, C4A, and C5A in addition to the configuration of the antenna-side circuit 11 according to the first preferred embodiment. The inductor L4A and the capacitors C3A, C4A, and C5A constitute a low pass filter LPF2A and are connected between the antenna-side terminal T1 and the inductor L1.

The transmission-side circuit 12A includes capacitors C6A and C7A in addition to the configuration of the transmission-side circuit 12 according to the first preferred embodiment. The capacitor C6A is connected between the inductor L2 and the transmission-side terminal T2. The capacitor C7A is connected between ground and a connection point between the capacitor C6A and the transmission-side terminal T2.

The reception-side circuit 13A includes inductors L5A, L6A, and L7A and capacitors C8A and C9A in addition to the configuration of the reception-side circuit 13 according to the first preferred embodiment. The inductor L3 corresponds to a first inductor. The inductor L5A corresponds to a second inductor.

The inductor L5A is electromagnetically coupled to the inductor L3. A first end of the inductor L5A is connected to the reception-side balanced terminal T4 via the inductor L6A. A second end of the inductor L5A is connected to the reception-side balanced terminal T5 via the inductor L7A. In addition, the inductor L5A is connected at its middle to ground.

A first end of the capacitor C8A is connected to a connection point between the inductor L6A and the reception-side balanced terminal T4. A first end of the capacitor C9A is connected to a connection point between the inductor L7A and the reception-side balanced terminal T5. A second end of the capacitor C8A is connected to a second end of the capacitor C9A.

At the time of transmission, the impedance of the external circuit CTL is set to be sufficiently low. Thus, the external control terminal T11 is grounded. In this case, similarly to the case of the first preferred embodiment, it is possible to regard the filter circuit 1A as a low pass filter. A transmission signal inputted to the transmission-side terminal T2 passes through the above-described low pass filter and is outputted from the antenna-side terminal T1. It should be noted that the low pass filter LPF2A is inserted in order to improve the attenuation characteristics of the low pass filter.

At the time of reception, the impedances of the external circuit CTL and the external circuit TX are set to be sufficiently high. In this case, similarly to the case of the first preferred embodiment, it is possible to regard the filter circuit 1A as a band pass filter. This band pass filter includes the antenna-side circuit 11A and the reception-side circuit 13A. In addition, the inductors L3, L5A, L6A, and L7A and the capacitors C8A and C9A constitute a balanced-to-unbalanced conversion circuit.

When the frequency of a reception signal inputted to the antenna-side terminal T1 is located within the pass band of the band pass filter, the reception signal passes through the band pass filter. The reception signal having passed therethrough is converted to a balanced signal by the balanced-to-unbalanced conversion circuit and is outputted from the reception-side balanced terminals T4 and T5.

According to the second preferred embodiment, similarly to the case of the first preferred embodiment, it is possible to switch between transmission and reception by controlling the impedance characteristics of the external circuit CTL. In other words, when the external control terminal T11 is grounded, it is possible to use the filter circuit 1A as a low pass filter. When the impedances of the external circuit CTL and the external circuit TX are set to be sufficiently high, it is possible to use the filter circuit 1A as a filter circuit including a band pass filter and a balanced-to-unbalanced conversion circuit. In addition, similarly to the case of the first preferred embodiment, the filter circuit 1A exhibits stable characteristics independent of a mounting form such as the line length of a line.

Figure 8A:
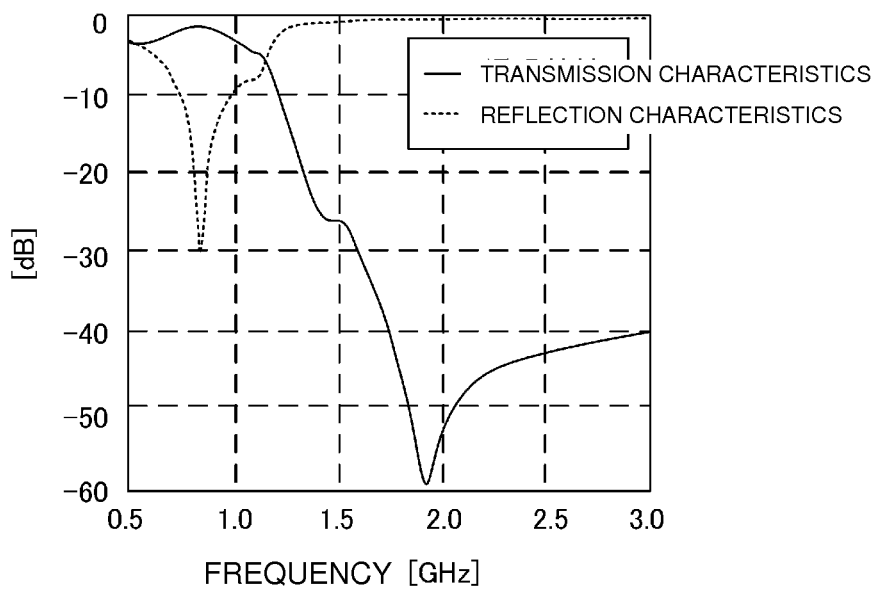
FIG. 8A is a diagram showing characteristics of the filter circuit when an external control terminal is grounded.

FIG. 8A is a diagram showing characteristics of the filter circuit 1A when the external control terminal T11 is grounded. In FIG. 8A, a solid line indicates transmission characteristics between the antenna-side terminal T1 and the transmission-side terminal T2, and a broken line indicates reflection characteristics at the transmission-side terminal T2. It should be noted that FIG. 8A shows actually measured values.

When the frequency of a signal is lower than about 0.8 GHz, the insertion loss is nearly 0 dB. As the frequency of the signal is increased to be higher than about 0.8 GHz, the insertion loss is rapidly increased as compared to the case of the filter circuit 1. On the other hand, when the frequency of the signal is higher than around 0.8 GHz, the return loss is nearly 0 dB. When the frequency of the signal is around 0.8 GHz, the return loss is decreased. In other words, the filter circuit 1A serves as a low pass filter whose pass band is a frequency band around 0.8 GHz and a frequency band lower than around 0.8 GHz, for example. In addition, since the low pass filter LPF2A is inserted, the attenuation characteristics of the low pass filter are improved on the high-frequency side as compared to the case of the filter circuit 1.

Figure 8B:
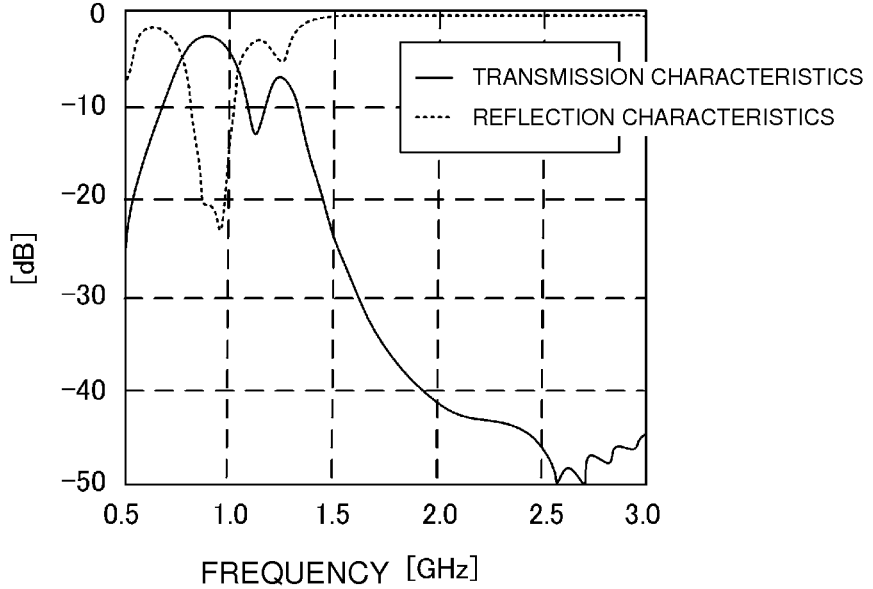
FIG. 8B is a diagram showing characteristics of the filter circuit when the impedances of external circuits are set to be sufficiently high.

FIG. 8B is a diagram showing characteristics of the filter circuit 1A when the impedances of the external circuit CTL and the external circuit TX are set to be sufficiently high. In FIG. 8B, a solid line indicates transmission characteristics when a signal is inputted from the antenna-side terminal T1 and outputted from the reception-side balanced terminals T4 and T5 in a differential mode, and a broken line indicates reflection characteristics in this case. It should be noted that FIG. 8B shows actually measured values.

When the frequency of the signal is around 0.8 GHz, the insertion loss becomes nearly 0 dB. As the frequency of the signal deviates from around 0.8 GHz, the insertion loss is rapidly increased as compared to the case of the filter circuit 1. On the other hand, when the frequency of the signal is around 0.8 GHz, the return loss is decreased. When the frequency of the signal is not around 1 GHz, the return loss is nearly 0 dB. In other words, the filter circuit 1A serves as a band pass filter whose pass band is around 0.8 GHz, for example. In addition, the attenuation characteristics of the band pass filter are improved on the high-frequency side as compared to the case of the filter circuit 1.

FIG. 9A is an external perspective view of a laminate 2A. FIG. 9B is an exploded perspective view of the laminate 2A.

The filter circuit 1A includes the laminate 2A having a rectangular or substantially rectangular parallelepiped shape, and the laminate 2A includes outer electrodes 21A to 28A on its surface. The outer electrodes 21A to 24A are spaced apart from each other at a predetermined interval and are located on a first side surface of the laminate 2A. The outer electrodes 21A to 24A are arranged in the order of their numerals. The outer electrode 25A is opposed to the outer electrode 24A, the outer electrode 26A is opposed to the outer electrode 23A, the outer electrode 27A is opposed to the outer electrode 22A, the outer electrode 28A is opposed to the outer electrode 21A, and the outer electrodes 25A to 28A are located on a second side surface of the laminate 2A (a surface opposite to the first side surface). The outer electrodes 21A to 28A are arranged so as to extend on a top surface and a bottom surface of the laminate 2A.

The laminate 2A includes dielectric layers 101A to 112A. The dielectric layers 101A to 112A are laminated in the order of their numerals.

A linear electrode 31A is located on the dielectric layer 101A. Linear electrodes 32A, 33A, 34A, 37A, and 38A are located on the dielectric layer 102A. Linear electrodes 32A, 33A, 35A, 36A, 37A, and 38A are located on the dielectric layer 103A. Linear electrodes 32A, 33A, 35A, 36A, and 39A are located on the dielectric layer 104A. Linear electrodes 32A, 33A, 35A, 36A, 37A, and 40A are located on the dielectric layer 105A. Linear electrodes 32A, 36A, 40A, and 41A are located on the dielectric layer 106A. The linear electrode 41A includes end portions 41A1 to 41A4. The linear electrodes on each layer are arranged in a loop shape or in a substantially loop shape.

The linear electrode 39A is arranged so as to overlap the linear electrodes 37A on the dielectric layers 103A and 105A when being seen from the lamination direction. Thus, the linear electrode 39A is magnetically coupled to the linear electrodes 37A on the dielectric layers 103A and 105A.

The linear electrodes 32A located on the dielectric layers 101A to 106A are sequentially connected to each other via via electrodes. The same applies to the linear electrodes 33A, 35A, 36A, 37A, 38A, and 40A located on the respective layers.

A first end of the linear electrode 31A is connected to an end portion of the linear electrode 32A on the dielectric layer 102A through a via electrode. A second end of the linear electrode 31A is connected to an end portion of the linear electrode 33A on the dielectric layer 102A through a via electrode.

A first end of the linear electrode 34A is connected to an end portion of the linear electrode 35A on the dielectric layer 103A through a via electrode. A second end of the linear electrode 34A is connected to an end portion of the linear electrode 36A on the dielectric layer 103A through a via electrode. An end portion of the linear electrode 37A on the dielectric layer 102A is connected to the outer electrode 23A. An end portion of the linear electrode 38A on the dielectric layer 102A is connected to the outer electrode 25A.

An end portion of the linear electrode 38A on the dielectric layer 103A is connected to a first end of the linear electrode 39A through a via electrode.

A second end of the linear electrode 39A is connected to an end portion of the linear electrode 40A on the dielectric layer 105A through a via electrode. A predetermined location on the linear electrode 39A is connected to a predetermined location on the linear electrode 37A on the dielectric layer 105A through a via electrode.

An end portion of the linear electrode 37A on the dielectric layer 105A is connected to the outer electrode 24A. Thus, the predetermined location on the linear electrode 39A is connected to the outer electrode 24A through the via electrode and a portion of the linear electrode 37A on the dielectric layer 105A.

An end portion of the linear electrode 33A on the dielectric layer 105A is connected to the end portion 41A1 of the linear electrode 41A through a via electrode. An end portion of the linear electrode 35A on the dielectric layer 105A is connected to the end portion 41A3 of the linear electrode 41A through a via electrode.

An end portion of the linear electrode 36A on the dielectric layer 106A is connected to the outer electrode 22A. An end portion of the linear electrode 40A on the dielectric layer 106A is connected to the outer electrode 26A.

Flat plate electrodes 61A, 62A, and 63A are located on the dielectric layer 107A. The flat plate electrode 61A is connected to the outer electrode 24A. The flat plate electrode 62A is connected to the end portion 41A2 of the linear electrode 41A through a via electrode. The flat plate electrode 63A is connected to an end portion of the linear electrode 32A on the dielectric layer 106A through a via electrode.

Flat plate electrodes 64A and 65A are located on the dielectric layer 108A. The flat plate electrode 64A is connected to the outer electrode 23A. The flat plate electrode 65A is connected to the outer electrode 28A. The flat plate electrodes 61A and 64A are opposed to each other with the dielectric layer 107A interposed therebetween. The flat plate electrodes 62A and 64A are opposed to each other with the dielectric layer 107A interposed therebetween. The flat plate electrodes 63A and 65A are opposed to other with the dielectric layer 107A interposed therebetween.

Flat plate electrodes 66A, 67A, and 68A are located on the dielectric layer 109A. The flat plate electrode 66A is connected to the outer electrode 22A. The flat plate electrode 67A is connected to the outer electrode 27A. The flat plate electrode 68A is connected to the flat plate electrode 63A through a via electrode. The flat plate electrodes 64A and 67A are opposed to each other with the dielectric layer 108A interposed therebetween. The flat plate electrodes 65A and 68A are opposed to each other with the dielectric layer 108A interposed therebetween.

Flat plate electrodes 69A, 70A, 71A, and 72A are located on the dielectric layer 110A. The flat plate electrode 69A is connected to the end portion 41A4 of the linear electrode 41A through a via electrode. The flat plate electrode 70A is connected to the outer electrode 25A. The flat plate electrode 71A is connected to the outer electrode 26A. The flat plate electrode 72A is connected to the outer electrode 21A. The flat plate electrodes 66A and 69A are opposed to each other with the dielectric layer 109A interposed therebetween. The flat plate electrodes 68A and 72A are opposed to each other with the dielectric layer 109A interposed therebetween.

Flat plate electrodes 73A and 74A are located on the dielectric layer 111A. The flat plate electrode 73A is connected to the outer electrode 21A. The flat plate electrodes 69A and 73A are opposed to each other with the dielectric layer 110A interposed therebetween. The flat plate electrodes 70A and 74A are opposed to each other with the dielectric layer 110A interposed therebetween. The flat plate electrodes 71A and 74A are opposed to each other with the dielectric layer 110A interposed therebetween.

Flat plate electrodes 75A, 76A, and 77A are located on the dielectric layer 112A. The flat plate electrode 76A is connected to the outer electrode 25A. The flat plate electrode 77A is connected to the outer electrode 26A. The flat plate electrode 75A is connected to the outer electrode 22A. The flat plate electrodes 73A and 75A are opposed to each other with the dielectric layer 111A interposed therebetween. The flat plate electrodes 74A and 76A are opposed to each other with the dielectric layer 111A interposed therebetween. The flat plate electrodes 74A and 77A are opposed to each other with the dielectric layer 111A interposed therebetween.

Next, correspondence between the circuit in FIG. 7 and the configuration in FIG. 9B will be described.

The antenna-side terminal T1 corresponds to the outer electrode 22A, the transmission-side terminal T2 corresponds to the outer electrode 28A, the reception-side balanced terminal T4 corresponds to the outer electrode 25A, the reception-side balanced terminal T5 corresponds to the outer electrode 26A, and the external control terminal T11 corresponds to the outer electrode 27A. The outer electrodes 21A and 24A are connected to ground.

The inductor L1 includes the linear electrode 41A. The inductor L2 includes the linear electrode 31A on the dielectric layer 101A, the linear electrodes 32A on the dielectric layers 102A to 106A, the linear electrodes 33A on the dielectric layers 102A to 105A, and the via electrodes connecting these electrodes. The inductor L3 includes the linear electrodes 37A on the dielectric layers 102A, 103A, and 105A and the via electrodes connecting these electrodes. The inductor L4A includes the linear electrode 34A on the dielectric layer 102A, the linear electrodes 35A on the dielectric layers 103 to 105A, the linear electrodes 36A on the dielectric layers 103A to 106A, and the via electrodes connecting these electrodes. The inductor L5A includes the linear electrode 39A on the dielectric layer 104A. The inductor L6A includes the linear electrodes 40A on the dielectric layers 105A and 106A and the via electrodes connecting these electrodes. The inductor L7A includes the linear electrodes 38A on the dielectric layers 102A and 103A and the via electrodes connecting these electrodes.

The capacitor C1 includes the flat plate electrodes 62A and 64A and the dielectric layer 107A. The capacitor C2 includes the flat plate electrodes 61A and 64A and the dielectric layer 107A. The capacitor C3A includes the flat plate electrodes 73A and 75A and the dielectric layer 111A. The capacitor C4A includes the flat plate electrodes 69A and 73A and the dielectric layer 110A. The capacitor C5A includes the flat plate electrodes 66A and 69A and the dielectric layer 109A. The capacitor C6A includes the flat plate electrodes 63A, 65A, and 68A, the dielectric layers 107A and 108A, and the via electrode connecting the flat plate electrodes 63A and 68A. The capacitor C7A includes the flat plate electrodes 68A and 72A and the dielectric layer 109A. The capacitor C8A includes the flat plate electrodes 70A, 74A, and 76A and the dielectric layers 110A and 111A. The capacitor C9A includes the flat plate electrodes 71A, 74A, and 77A and the dielectric layers 110A and 111A.

According to the second preferred embodiment, the predetermined location on the linear electrode 39A is connected to the predetermined location on the linear electrode 37A on the dielectric layer 105A through the via electrode. Thus, the predetermined location on the linear electrode 39A is connected to the outer electrode 24A through the via electrode and a portion of the linear electrode 37A on the dielectric layer 105A. In other words, a predetermined location on the inductor L5A is connected to ground through the via electrode and a portion of the inductor L3. Thus, it is possible to optimally adjust a reference of the phase of the balanced-to-unbalanced conversion circuit. Therefore, it is possible to adjust the balance characteristics of the filter circuit 1A.

In addition, the capacitors C8A and C9A are not grounded. Thus, the reference of the phase of the balanced-to-unbalanced conversion circuit is not influenced by a change in the ground potential due to a mounting form of the filter circuit 1A. Therefore, it is possible to stabilize the balance characteristics of the filter circuit 1A. In addition, it is not necessary to connect the flat plate electrode 74A partially constituting the capacitors C8A and C9A to the outer electrode 21A or the outer electrode 24A through a via electrode or a linear electrode, and thus it is possible to reduce the size of the laminate 2A.

Moreover, electrode layers for transmission are located on one side of the laminate 2A, and electrode layers for reception are located on the other side of the laminate 2A. In other words, the electrode layers constituting the transmission-side circuit 12A are located on the one side of the laminate 2A, and the electrode layers constituting the reception-side circuit 13A are located on the other side of the laminate 2A. Thus, the electrode layers constituting the inductor of the transmission-side circuit 12A do not overlap the electrode layers constituting the inductors of the reception-side circuit 13A when seen from the lamination direction. Thus, it is possible to improve the isolation characteristics of the filter circuit 1A.

Moreover, the linear electrodes are located on a first principal surface side of the laminate 2A, and the flat plate electrodes are located on a second principal surface side of the laminate 2A. Thus, it is possible to prevent magnetic fields generated around the linear electrodes from being blocked by the flat plate electrodes. Therefore, it is possible to improve the Q value of the filter circuit 1A.

Third Preferred Embodiment

Figure 10:
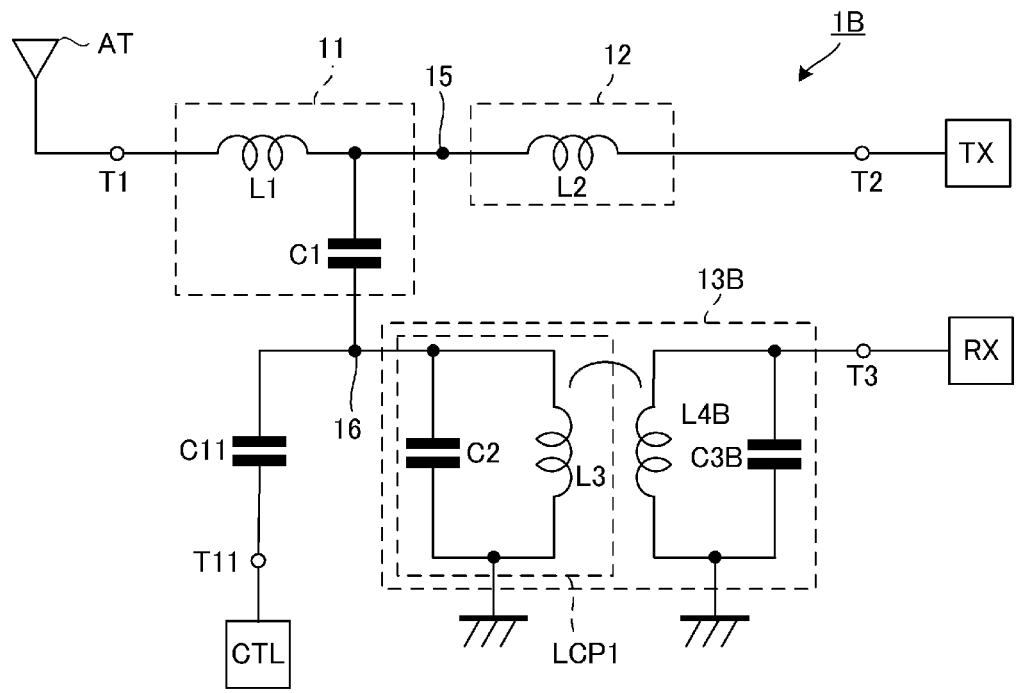
FIG. 10 is a circuit diagram showing a filter circuit according to a third preferred embodiment of the present invention.

A filter circuit 1B according to a third preferred embodiment of the present invention will be described. FIG. 10 is a circuit diagram showing the filter circuit 1B. The filter circuit 1B includes a reception-side circuit 13B instead of the reception-side circuit 13 according to the first preferred embodiment. Similarly to the case of the first preferred embodiment, the reception-side circuit 13B is connected to the connection point 16, the reception-side terminal T3, and ground.

The filter circuit 1B includes an LC parallel resonant circuit including an inductor L4B and a capacitor C3B, in addition to the configuration in the first preferred embodiment. The LC parallel resonant circuit is connected between the reception-side terminal T3 and ground. The inductor L4B is electromagnetically coupled to the inductor L3.

At the time of transmission, the impedance of the external circuit CTL is set to be sufficiently low. Thus, the external control terminal T11 is grounded. In this case, similarly to the case of the first preferred embodiment, it is possible to regard the filter circuit 1B as a low pass filter. A transmission signal inputted to the transmission-side terminal T2 passes through this low pass filter and is outputted from the antenna-side terminal T1.

At the time of reception, the impedances of the external circuit CTL and the external circuit TX are set to be sufficiently high. In this case, similarly to the case of the first preferred embodiment, it is possible to regard the filter circuit 1B as a band pass filter. This band pass filter includes the antenna-side circuit 11 and the reception-side circuit 13B. When the frequency of a reception signal inputted to the antenna-side terminal T1 is located within the pass band of the band pass filter, the reception signal passes through the band pass filter and is outputted from the reception-side terminal T3.

Figure 11:
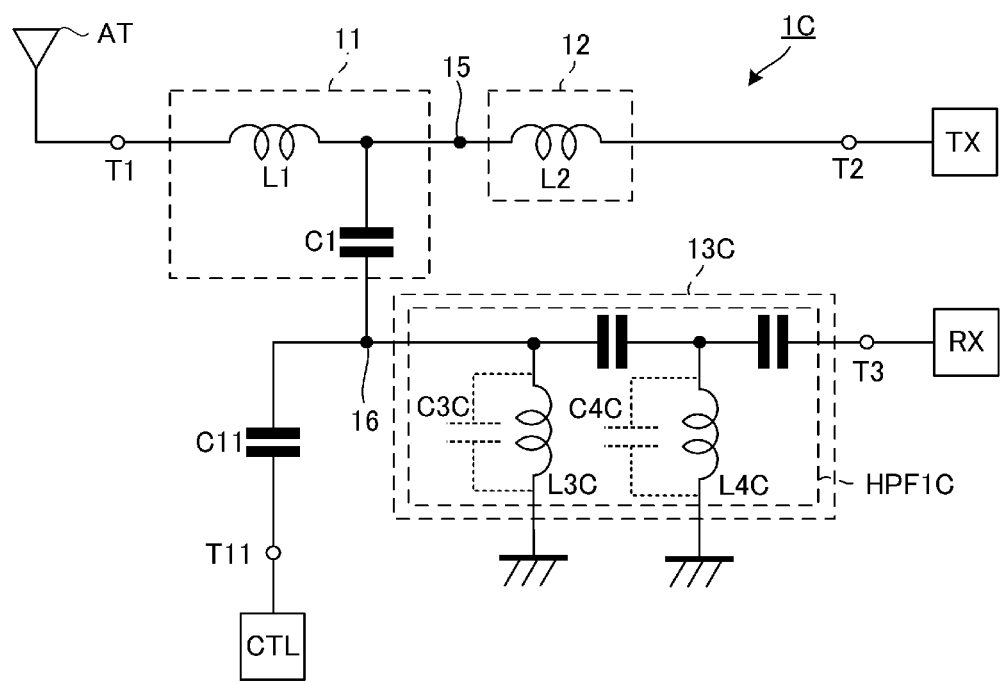
FIG. 11 is a circuit diagram showing the filter circuit according to the third preferred embodiment of the present invention.
Figure 12:
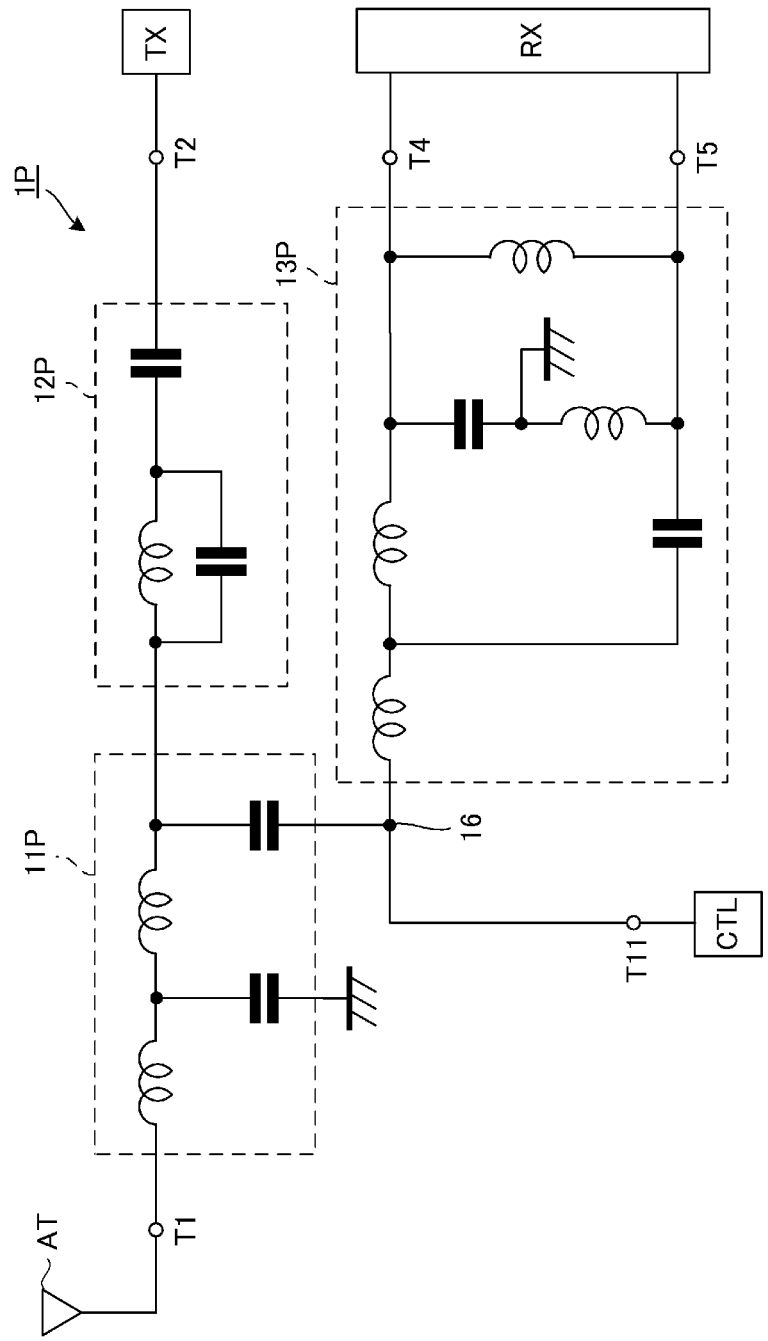
FIG. 12 is a circuit diagram showing an existing filter circuit.

It should be noted that a filter circuit according to a preferred embodiment of the present invention may be a filter circuit 1C. FIG. 11 is a circuit diagram showing the filter circuit 1C. The filter circuit 1C includes a reception-side circuit 13C instead of the reception-side circuit 13 according to the first preferred embodiment. Similarly to the case of the first preferred embodiment, the reception-side circuit 13C is connected to the connection point 16, the reception-side terminal T3, and ground. The reception-side circuit 13C includes a high pass filter HPF1C instead of the LC parallel resonant circuit LCP1 according to the first preferred embodiment. The high pass filter HPF1C includes inductors L3C and L4C connected to ground.

Electrodes constituting the inductors L3C and L4C (hereinafter, referred to as inductor electrodes) have minute capacitances. Capacitors C3C and C4C shown in FIG. 11 exhibit the minute capacitances. The inductor L3C and the capacitor C3C and the inductor L4C and the capacitor C4C constitute LC parallel resonant circuits. Thus, when the filter circuit 1C is mounted, an LC parallel resonant circuit that is the same as that in the first preferred embodiment occurs. Therefore, in the filter circuit 1C as well, it is possible to switch between transmission and reception by the external control terminal T11.

It should be noted that the capacitance that each inductor electrode itself has is preferably changed depending on the shape of each inductor electrode. For example, when each inductor electrode has a spiral or substantially spiral shape as in the second preferred embodiment, a capacitance occurs even between the linear electrodes constituting the inductor electrodes. Thus, the capacitance that each inductor electrode has is relatively increased.

In addition, when the capacitance that each inductor electrode has is taken into account, the filter circuit may be configured such that the reception-side circuit includes only an inductor. In this case as well, a parallel resonant circuit is provided, and thus it is possible to obtain the same advantageous effects as those in the first preferred embodiment.

At the time of transmission, the impedance of the external circuit CTL is set to be sufficiently low. Thus, the external control terminal T11 is grounded. In this case, it is possible to use the filter circuit 1C as a low pass filter including the antenna-side terminal T1 and the transmission-side terminal T2.

At the time of reception, the impedances of the external circuit CTL and the external circuit TX are set to be sufficiently high. In this case, it is possible to use the filter circuit 1C as a high pass filter including the antenna-side terminal T1 and the reception-side terminal T3.

According to the third preferred embodiment, as described above, it is possible to switch between transmission and reception by controlling the impedance characteristics of the external circuit CTL. In addition, similarly to the case of the first preferred embodiment, the filter circuits 1B and 1C exhibit stable characteristics independent of a mounting form such as the line length of the line.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter circuit comprising:
    a first circuit connected to a first terminal;
    a second circuit connected to a second terminal and the first circuit;
    a third circuit connected to a third terminal, the first circuit, and ground;
    an external connection capacitor including a first end connected directly to a connection point between the first and third circuits and a second end connected directly to an external control terminal; and
    the external connection capacitor and the third circuit define an LC parallel resonator; wherein
    the first and second circuits constitute a first filter circuit;
    the first and third circuits constitute a second filter circuit;
    the third circuit includes an LC parallel resonant circuit;
    a first end of the LC parallel resonant circuit is connected to the connection point; and
    a second end of the LC parallel resonant circuit is connected to ground.

2. The filter circuit according to claim 1, wherein
    when the first filter circuit is used, the external control terminal is grounded; and
    when the second filter circuit is used, the external control terminal is opened.

3. The filter circuit according to claim 1, wherein
    the first circuit includes a capacitor; and
    the capacitor is connected to the connection point.

4. The filter circuit according to claim 1, wherein
    the first filter circuit includes a low pass filter circuit; and
    the second filter circuit includes a band pass filter circuit.

5. The filter circuit according to claim 1, wherein
    the third circuit is connected to a fourth terminal and includes first and second inductors;
    the third and fourth terminals constitute a balanced terminal;
    the first inductor constitutes the LC parallel resonant circuit;
    the second inductor is electromagnetically coupled to the first inductor; and
    the second inductor is connected between the third and fourth terminals.

6. The filter circuit according to claim 1, wherein
    the filter circuit includes a dielectric layer, an electrode layer, and a via electrode;
    the dielectric layer and the electrode layer are laminated on each other;
    the via electrode extends through the dielectric layer;
    the filter circuit includes an inductor and a capacitor;
    a plurality of the electrode layers are connected to each other via the via electrode to define the inductor; and
    two of the electrode layers are opposed to each other with the dielectric layer interposed therebetween to define the capacitor.

7. The filter circuit according to claim 1, further comprising a laminate having a rectangular or substantially rectangular parallelepiped shape.

8. The filter circuit according to claim 7, further comprising outer electrodes disposed on at least one surface of the laminate.

9. The filter circuit according to claim 7, wherein the laminate includes dielectric layers and electrode layers stacked on each other.

10. The filter circuit according to claim 9, further comprising linear electrodes disposed on at least one of the dielectric layers.

11. The filter circuit according to claim 10, wherein the linear electrodes are arranged in a loop shape or a substantially loop shape.

12. The filter circuit according to claim 9, further comprising plate electrodes disposed on at least one of the dielectric layers.

13. The filter circuit according to claim 2, wherein when the when the first filter circuit is used and the external control terminal is grounded, the filter circuit is a T-type low pass filter.

14. The filter circuit according to claim 9, further comprising linear electrodes disposed on the dielectric layers and connected to each other through via electrodes.

15. The filter circuit according to claim 7, wherein the laminate includes first and second groups of electrode layers disposed on opposing sides of the laminate so as not to overlap with each other.

16. The filter circuit according to claim 7, further comprising linear electrodes on a first principal surface side of the laminate and flat plate electrodes located on a second principal surface side of the laminate.

* * * * *